US006874568B2

(12) United States Patent
Lai

(10) Patent No.: US 6,874,568 B2
(45) Date of Patent: Apr. 5, 2005

(54) BOTTOM FIXATION TYPE INTEGRATED CIRCUIT CHIP COOLING STRUCTURE

(75) Inventor: Yaw-Huey Lai, Taipei Hsien (TW)

(73) Assignee: Tai-Sol Electronics Co., Ltd., Taipei Hsien (TW)

( * ) Notice: Subject to any disclaimer, the term of this patent is extended or adjusted under 35 U.S.C. 154(b) by 0 days.

(21) Appl. No.: 10/245,332

(22) Filed: Sep. 18, 2002

(65) Prior Publication Data

US 2004/0016534 A1 Jan. 29, 2004

(30) Foreign Application Priority Data

Jul. 26, 2002 (TW) ...................... 91211494 U

(51) Int. Cl.[7] ............................................. F28D 15/04
(52) U.S. Cl. ................. 165/104.26; 165/80.3; 165/80.4; 165/104.33; 361/700
(58) Field of Search ................. 165/170, 171, 165/80.3, 80.4, 104.33, 104.26, 185; 361/700; 250/722, 715

(56) References Cited

U.S. PATENT DOCUMENTS

| | | | | |
|---|---|---|---|---|
| 3,270,250 A | * | 8/1966 | Davis ........................ | 165/80.4 |
| 4,938,280 A | * | 7/1990 | Clark ........................ | 165/80.4 |
| 5,453,911 A | * | 9/1995 | Wolgemuth et al. ....... | 165/80.4 |
| 5,660,229 A | * | 8/1997 | Lee et al. .............. | 165/104.26 |
| 6,302,192 B1 | | 10/2001 | Dussinger et al. | |
| 6,588,647 B2 | * | 7/2003 | Yamada et al. ............. | 165/170 |
| 6,650,544 B1 | * | 11/2003 | Lai ............................ | 361/700 |

FOREIGN PATENT DOCUMENTS

| | | | | |
|---|---|---|---|---|
| GB | 0872894 | * | 7/1961 | ................ 165/80.4 |
| GB | 1402509 | * | 8/1975 | ............ 165/104.26 |
| JP | 0060462 | * | 5/1977 | ............ 165/104.33 |

OTHER PUBLICATIONS

Vol. 20, No. 6, Nov. 1977, U.S.A., Balderes et al.*
Parker, Sybil P. (Editor in Chief), McGraw–Hill Dictionary of Mechanical and Design Engineering, 1984, McGraw–Hill Book Company, New York, pp. 126 and 187.*

* cited by examiner

Primary Examiner—Ljiljana Ciric
(74) Attorney, Agent, or Firm—Bacon & Thomas

(57) ABSTRACT

A bottom fixation type integrated circuit chip cooling structure device. The device is constructed to include a top plate member and a bottom plate member bonded together and defining a vapor chamber between the top and bottom plate member, and connecting members are provided between the top and bottom plate members each having a bottom end passed through a respective through hole in the bottom plate member and a bottom screw hole in the bottom end for mounting. A heat sink is bonded to the top surface of the top plate member, and an internally sintered metal capillary wick is provided within the vapor chamber.

5 Claims, 6 Drawing Sheets

US 6,874,568 B2

BOTTOM FIXATION TYPE INTEGRATED CIRCUIT CHIP COOLING STRUCTURE

BACKGROUND OF THE INVENTION

1. Field of the Invention

The present invention relates to an integrated circuit chip cooling structure for cooling an integrated circuit chip and, more specifically, to a bottom fixation type integrated circuit chip cooling structure.

2. Description of the Related Art

Heat sinks are commonly used in advanced computers or electronic apparatus to dissipate heat from an integrated circuit chip, for example, the CPU, for the advantage of superior heat transfer efficiency. U.S. Pat. No. 6,302,192, entitled "Integrated circuit heat pipe heat spreader with through mounting holes", shows such an example. According to this design, the heat pipe is held tightly against the heat source by mounting holes, which penetrate the structure of the heat pipe but are sealed off from the vapor chamber because they each are located within a sealed structure such as a pillar or the solid layers of the casing surrounding the vapor chamber. This design is still not satisfactory in function. Because of the weak structural strength in the area around the mounting holes, the mounting holes of the heat spreader are not practical for fastening to a circuit board by screws.

SUMMARY OF THE INVENTION

The present invention has been accomplished to provide a bottom fixation type integrated circuit chip cooling structure, which eliminates the aforesaid drawback. It is therefore the main object of the present invention to provide a bottom fixation type integrated circuit chip cooling structure, which achieves a satisfactory heat sink fixation effect. It is another object of the present invention to provide a bottom fixation type integrated circuit chip cooling structure, which can easily and firmly fastened to a circuit board by screws. To achieve these and other objects of the present invention, the bottom fixation type integrated circuit chip cooling structure comprises a top plate member, the top plate member having an edge lip that bounds a top surface and a bottom surface; a bottom plate member, the bottom plate member having an edge lip that bounds a top surface and a bottom surface, and at least one through hole through the top and bottom surfaces, the edge lips of the top and bottom plate members being bonded together so as to define a vapor chamber between the top and bottom plate member; at least one externally threaded connecting member provided between the top plate member and the bottom plate member corresponding to the at least one through hole, the at least one connecting member each having a bottom end inserted downwardly through one of the at least one through hole and peripherally sealed to the periphery of the corresponding through hole for mounting; a heat sink bonded to the top surface of the top plate member; and an internally sintered metal capillary wick provided within the vapor chamber.

DETAILED DESCRIPTION OF THE PREFERRED EMBODIMENT

Figure 1:
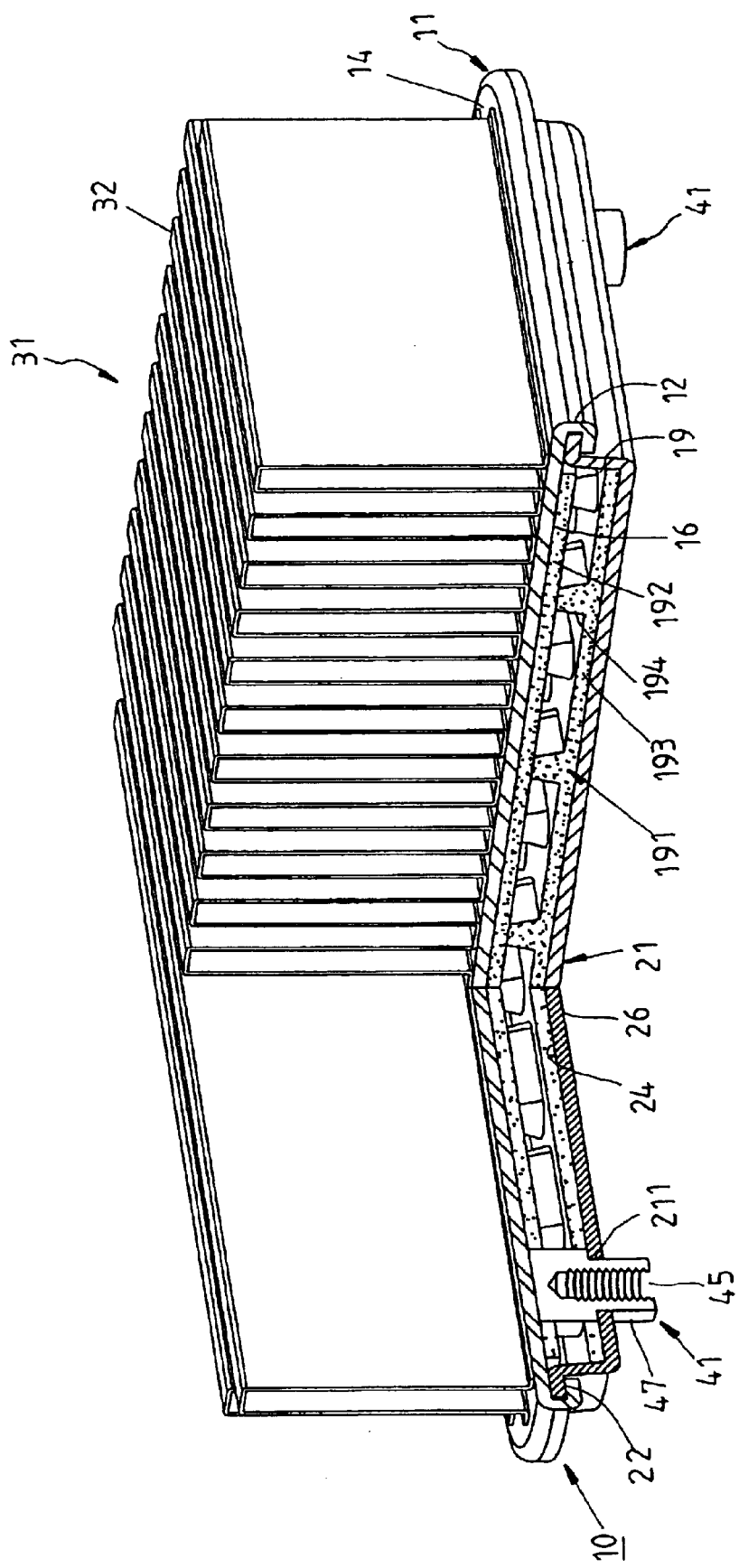
FIG. 1 is a sectional elevation of a bottom fixation type integrated circuit chip cooling structure constructed according to the first embodiment of the present invention.
Figure 2:
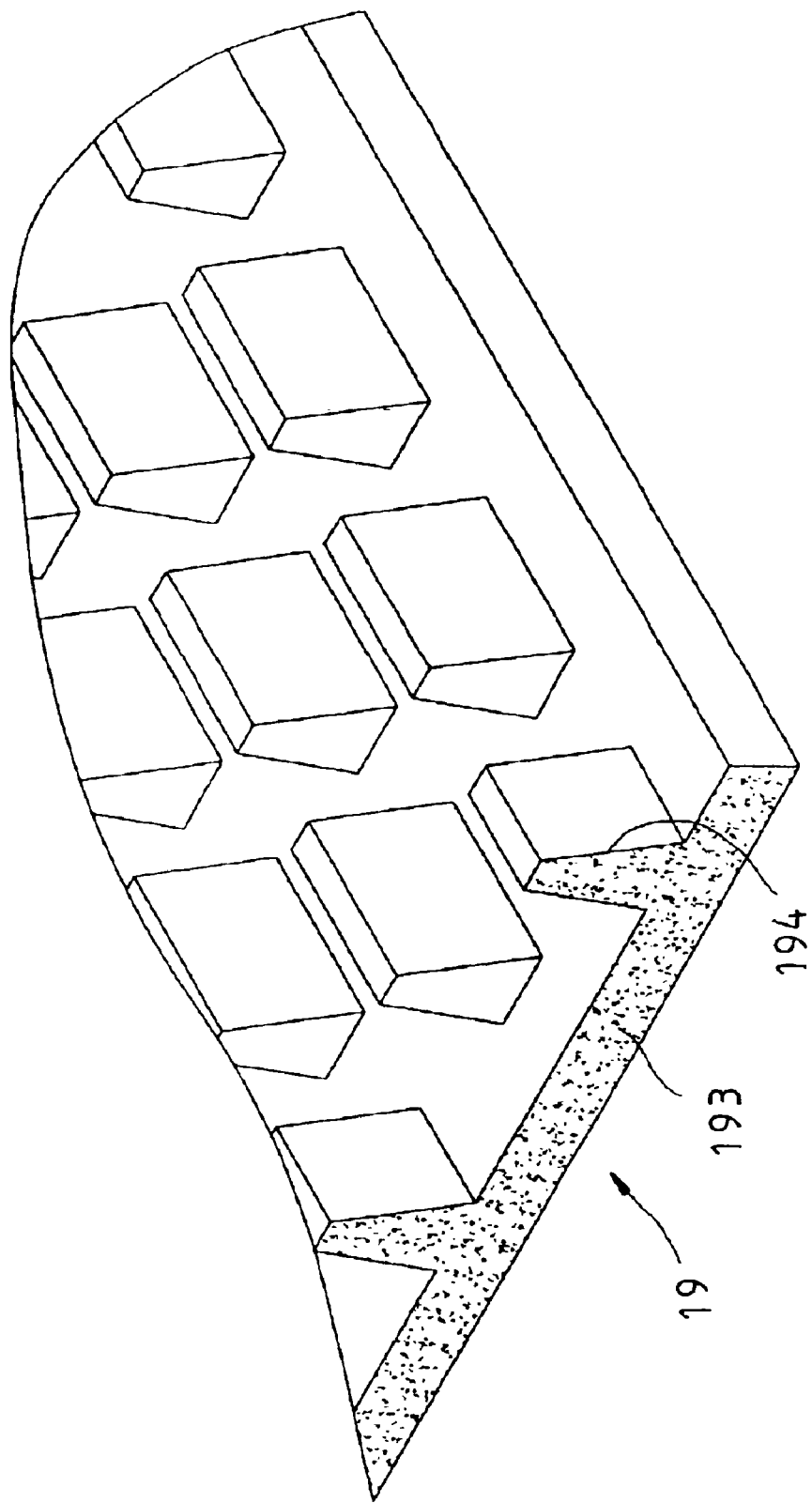
FIG. 2 is an enlarged view of a part of the first embodiment of the present invention, showing the structure of the internally sintered metal capillary wick.

Referring to FIGS. 1 and 2, a bottom fixation type integrated circuit chip cooling structure 10 in accordance with the first embodiment of the present invention is shown comprised of a top plate member 11, a bottom plate member 21, and a heat sink 31.

The top plate member 11 has an edge lip 12 that bounds a top surface 14 and a bottom surface 16.

The bottom plate member 21 has an edge lip 22 that bounds a top surface 24 and a bottom surface 26. The edge lip 22 of the bottom plate member 21 is bonded to the edge lip 12 of the first plate member 11 so as to define a vapor chamber 19 between the top plate member 11 and the bottom plate member 21. An internally sintered metal capillary wick 191 is provided within the vapor chamber 19. The internally sintered metal capillary wick 191 is comprised of an upper plate-like wick element 192 located on the bottom surface 16 of the top plate member 11, a bottom plate-like wick element 193 located on the top surface 24 of the bottom plate member 21, and a plurality of vertical wick element 194 provided between the upper plate-like wick element 192 and the bottom plate-like wick element 193. The vertical wick elements 194 each have a bottom side integral with the bottom plate-like wick element 193, and a top side stopped at the bottom side of the top plate-like wick element 192. The top plate-like wick element 192, the bottom plate-like wick element 193, and the vertical wick elements 194 define a liquid passage. The space between the top plate-like wick element 192 and the bottom plate-like wick element 193 serves as an air passage. Therefore, the whole structure of the top plate member 11, the bottom plate member 21, and the internally sintered metal capillary wick 191 is convenient for conversion between liquid phase and vapor phase. The bottom plate member 21 has a plurality of through holes 211 through the top surface 24 and the bottom surface 26. A plurality of internally threaded connecting members 41 are installed in the plate members 11 and 21 corresponding to the through holes 211 of the bottom plate member 11, each having a top end inserted through the top plate-shaped wick element 192 and adhered to the bottom surface 16 of the top plate member 11 and a bottom end inserted through the bottom plate-like wick element 193 and one through hole 211 of the bottom plate member 21 to the outside of the vapor chamber 19. The bottom end of each connecting member 41 terminates in a foot 47. The periphery of each through hole 211 of the bottom plate member 21 is sealed to the periphery of the corresponding connecting member 41 in an airtight condition. Each connecting member 41 further has a center screw hole 45 axially extended through the center of the foot 47.

The heat sink 31 is comprised of a plurality of radiation fins 32 each having a bottom side bonded to the top surface 14 of the top plate member 11.

Figure 3:
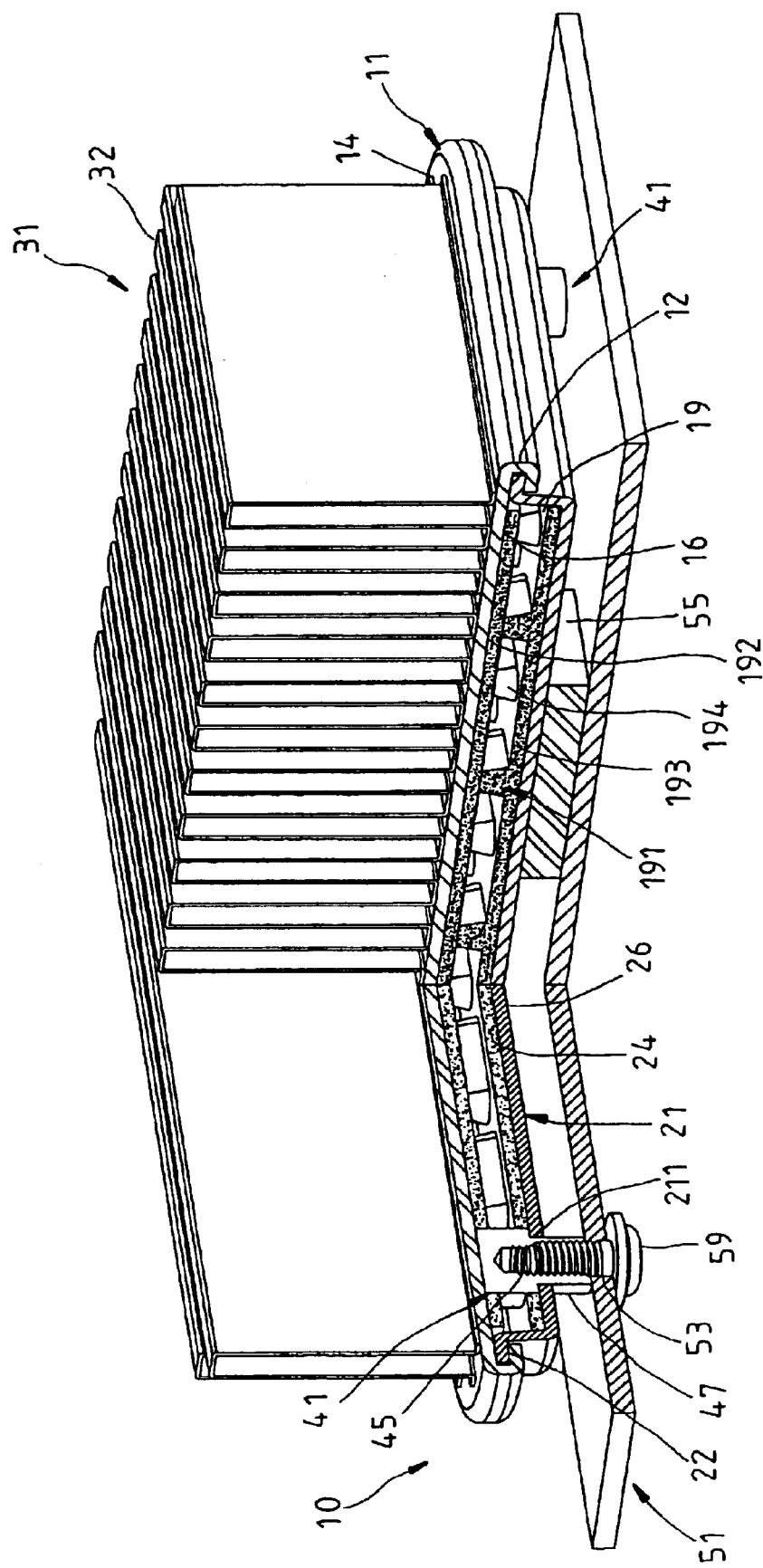
FIG. 3 shows an application example of the first embodiment of the present invention.

Because of the arrangement of the connecting members 41, the bottom fixation type integrated circuit chip cooling structure 10 has a strong mounting structure on the outside for the installation of screws 59 to fix the bottom fixation type integrated circuit chip cooling structure 10 to a heat source (see FIG. 3). Further, the structure of the internally sintered metal capillary wick 191 facilitates conversion between liquid phase and vapor phase.

Figure 4:
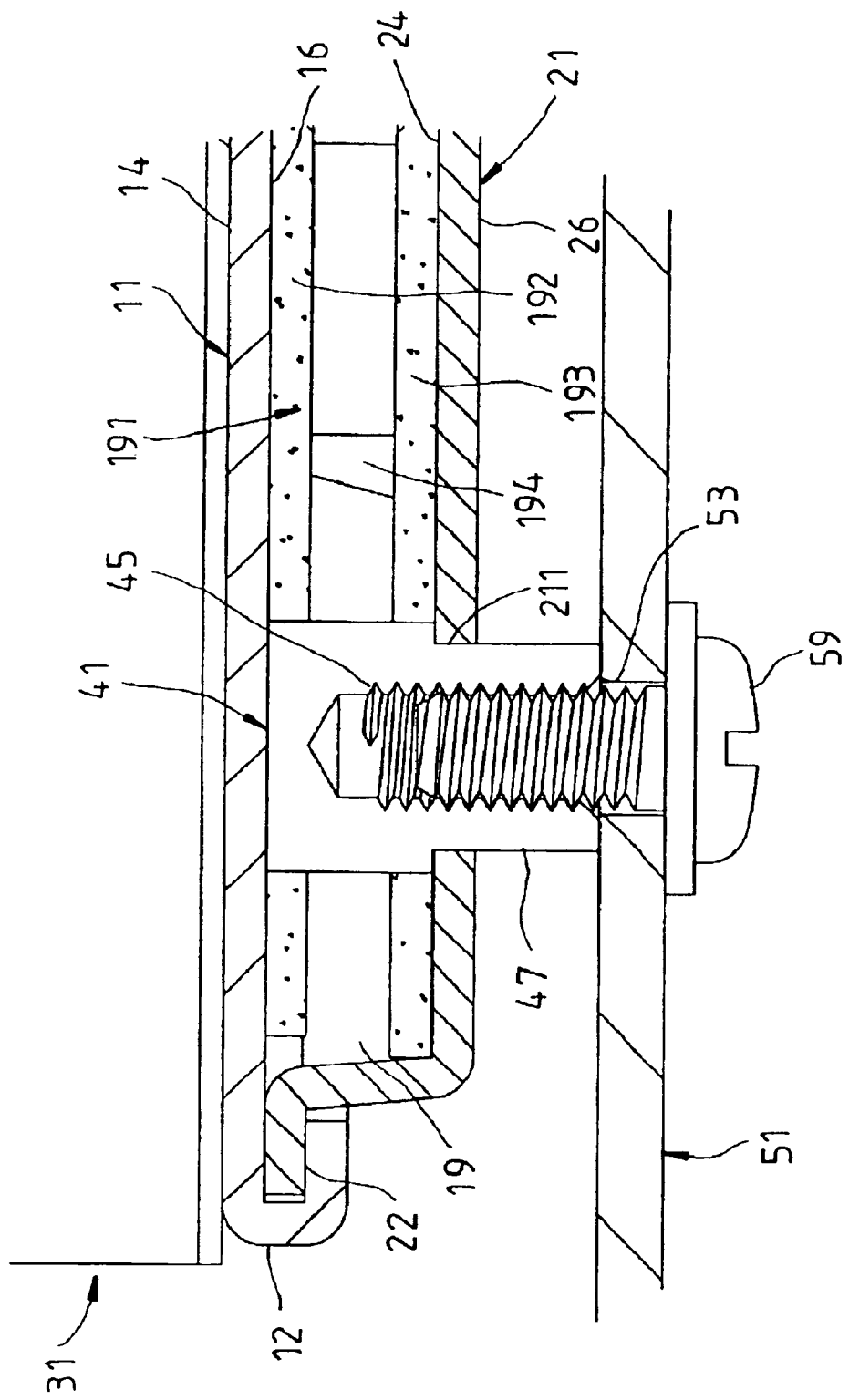
FIG. 4 is an enlarged view of a part of FIG. 3.

Referring to FIGS. 3 and 4, screws 59 are mounted in respective through holes 53 of the circuit board 51 carrying the heat source 55 from the bottom side and threaded into the center screw hole 45 of each connecting member 41 respectively to fix the bottom fixation type integrated circuit chip cooling structure 10 to the circuit board 51. When installed, the foot 47 of each connecting member 41 keeps the bottom plate member 21 spaced above the top side of the circuit board 51 at a distance corresponding to the height of the heat source 55 so that the heat source 55 is maintained is close contact with the bottom surface 26 of the bottom plate member 21 for quick dissipation of heat.

Figure 5:
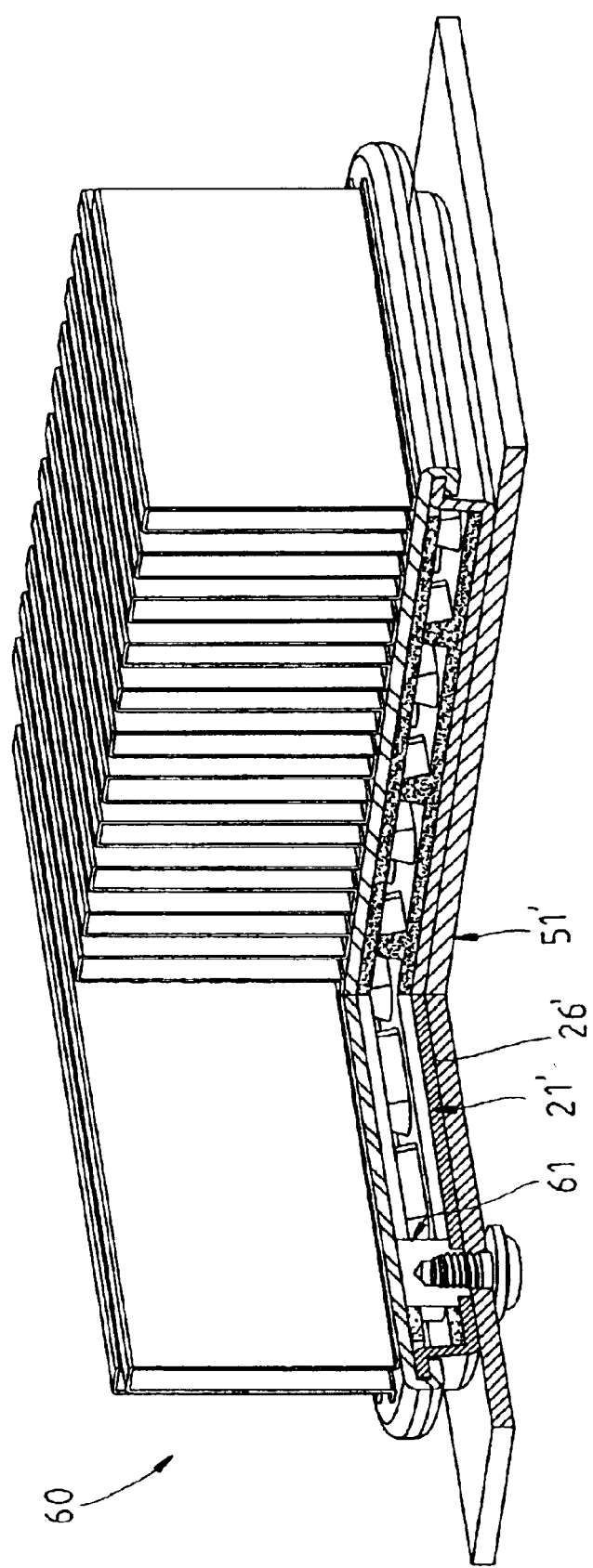
FIG. 5 shows an application example of the second embodiment of the present invention.

FIG. 5 shows a bottom fixation type integrated circuit chip cooling structure 60 according to the second embodiment of the present invention. This embodiment is similar to the aforesaid first embodiment with the exception of the connecting members. According to this embodiment, the connecting members, referenced by 61, each have a bottom end disposed in flush with the bottom surface 26' of the bottom plate member 21'. When installed, the circuit board 51' is directly attached to the bottom surface 26' of the bottom plate member 21'. According to this embodiment, the bottom fixation type integrated circuit chip cooling structure 60 directly dissipates heat from the circuit board 51'. This embodiment achieves a strong mounting effect same as the aforesaid first embodiment. Because the use and structural concept of this second embodiment are same as the aforesaid first embodiment, nor further detailed description in these regards is necessary.

Figure 6:
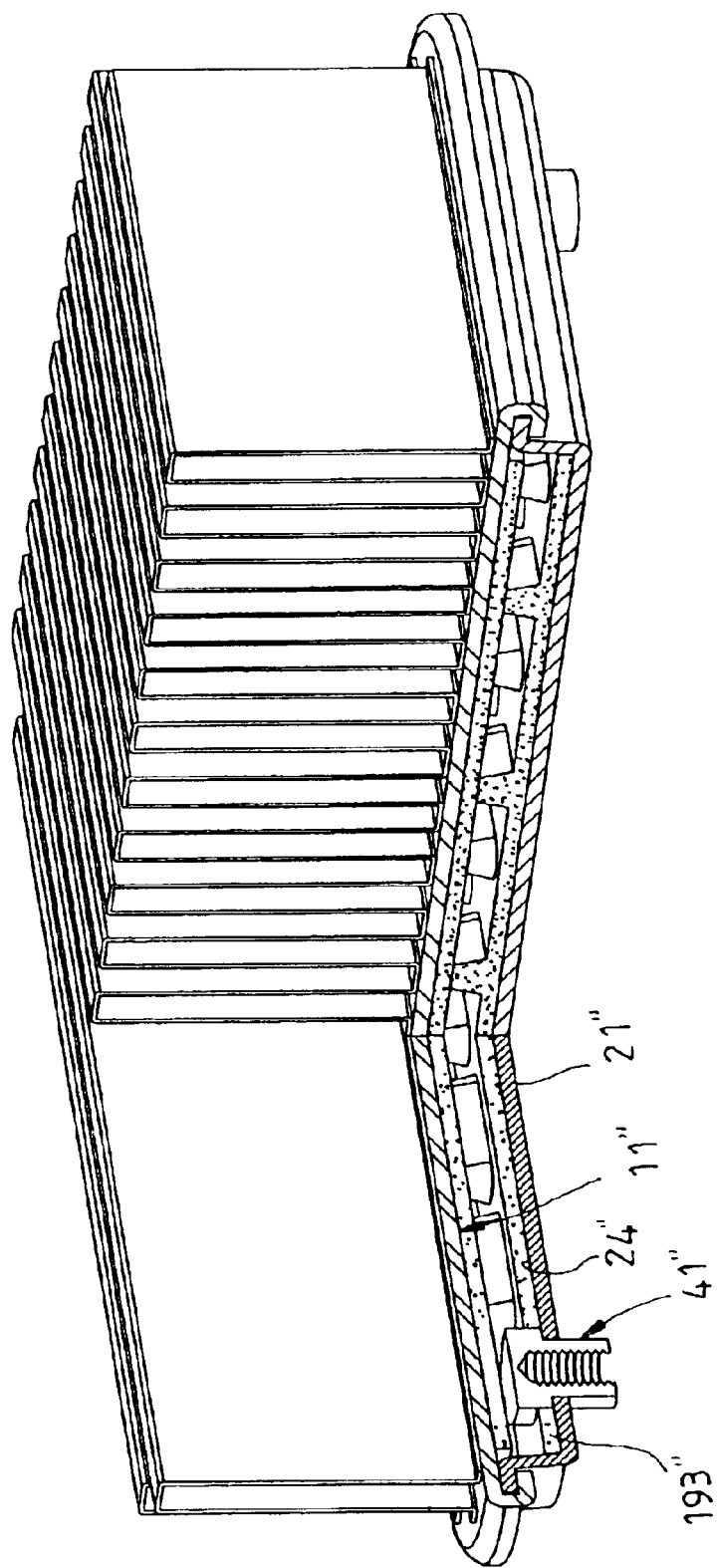
FIG. 6 illustrates an alternate form of the connecting member in the bottom fixation type integrated circuit chip cooling structure according to the present invention.

FIG. 6 shows another alternate form of the arrangement of the connecting members. According to this embodiment, the connecting members 41" are directly fixedly fastened to the bottom plate member 21" and spaced below the top plate member 11" at a distance. The bottom end of each connecting member 41" passes through the bottom plate-like wick element 193" and the bottom plate member 21". The bottom plate-like wick element 193" rests on the top surface 24" of the bottom plate member 21".

According to the aforesaid first embodiment, the connecting members 41 downwardly protrude over the bottom side of the bottom plate member 21 of the bottom fixation type integrated circuit chip cooling structure 10 at a distance so as to space the bottom fixation type integrated circuit chip cooling structure 10 above the circuit board at a distance for easy installation of the heat source 55. Further, the installation of the bottom fixation type integrated circuit chip cooling structure 10 is easy. Simply by threading the respective screws 59 into the center screw hole 45 of each connecting member 41, the bottom fixation type integrated circuit chip cooling structure 10 is fixedly fastened to the circuit board 51.

A prototype of bottom fixation type integrated circuit chip cooling structure has been constructed with the features of FIGS. 1~5. The bottom fixation type integrated circuit chip cooling structure functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A bottom fixation type integrated circuit chip cooling structure comprising:

a top plate member, said top plate member having an edge lip that bounds a top surface and a bottom surface;

a bottom plate member, said bottom plate member having an edge lip that bounds a top surface and a bottom surface, the edge lips of said top and bottom plate members being bonded together so as to define a vapor chamber between said top and bottom plate members;

wherein said bottom plate member has at least one through hole;

at least one internally threaded connecting member provided between said top plate member and said bottom plate member corresponding to said at least one through hole, said at least one internally threaded connecting member having a bottom end inserted downwardly through one of said at least one through hole and peripherally sealed to the periphery of the corresponding through hole for mounting;

said at least one internally threaded connecting member each has a top end thereof bonded to the bottom surface of said top plate member, so that said internally threaded connecting member extends through the bottom plate member;

the bottom end of said at least one connecting member is configured to attach to a circuit board;

a heat sink bonded to the top surface of said top plate member; and an internally sintered metal capillary wick provided within said vapor chamber.

2. The bottom fixation type integrated circuit chip cooling structure as claimed in claim 1, wherein each said at least one internally threaded connecting member has a respective bottom end thereof downwardly extended out of said bottom plate member through the respective through hole and forming a foot.

3. The bottom fixation type integrated circuit chip cooling structure as claimed in claim 1, wherein each said at least one connecting member has a bottom center screw hole in the respective bottom end.

4. The bottom fixation type integrated circuit chip cooling structure as claimed in claim 1, wherein said internally sintered metal capillary wick comprises an upper plate-shaped wick element located on the bottom surface of said top plate member, a bottom plate-like wick element located on the top surface of said bottom plate member, and a plurality of vertical wick elements provided between said upper plate-like wick element and said bottom plate-like wick element, said vertical wick elements each having a first end integral with one of said top and bottom plate members and a second end supported on the other of said top and bottom plate members.

5. The bottom fixation type integrated circuit chip cooling structure as claimed in claim 1, wherein said heat sink is comprised of a plurality of radiation fins directly bonded to the top surface of said top plate member.

* * * * *